(12) United States Patent
Chang

(10) Patent No.: US 7,778,789 B2
(45) Date of Patent: Aug. 17, 2010

(54) DIGITAL PHASE CALIBRATION METHOD AND SYSTEM

(75) Inventor: Jia-Han Chang, Taipei (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 11/736,736

(22) Filed: Apr. 18, 2007

(65) Prior Publication Data

US 2008/0027668 A1  Jan. 31, 2008

Related U.S. Application Data

(60) Provisional application No. 60/820,610, filed on Jul. 28, 2006.

(51) Int. Cl.
 *G01R 35/00* (2006.01)
(52) U.S. Cl. .................................... 702/106
(58) Field of Classification Search ............. 702/72, 702/106, 89; 324/601, 617; 348/536, 538
 See application file for complete search history.

(56) References Cited

U.S. PATENT DOCUMENTS

| | | | |
|---|---|---|---|
| 6,268,848 B1 * | 7/2001 | Eglit ........................... 345/213 |
| 6,307,498 B1 | 10/2001 | Eglit | |
| 6,483,447 B1 * | 11/2002 | Eglit ........................... 341/111 |
| 6,583,447 B2 | 6/2003 | Wang et al. | |
| 6,654,432 B1 * | 11/2003 | O'Shea et al. ............... 375/354 |
| 7,257,499 B2 * | 8/2007 | Maier ........................... 702/67 |
| 2003/0186666 A1 * | 10/2003 | Sindhushayana ............ 455/260 |
| 2004/0227858 A1 * | 11/2004 | Yang ........................... 348/572 |
| 2006/0268174 A1 * | 11/2006 | Obara et al. ................. 348/571 |
| 2007/0097263 A1 * | 5/2007 | Kim ............................ 348/521 |
| 2007/0146027 A1 * | 6/2007 | Lai .............................. 327/159 |
| 2007/0223640 A1 * | 9/2007 | Tinker ......................... 375/376 |
| 2007/0237220 A1 * | 10/2007 | Kuo ......................... 375/240.02 |

* cited by examiner

*Primary Examiner*—Michael P Nghiem
(74) *Attorney, Agent, or Firm*—Thomas, Kayden, Horstemeyer & Risley

(57) ABSTRACT

A method of digital phase calibration is disclosed. An input signal is sampled using a clock. The sample points of the sampled signal are changed by a scaler. A phase calibration is performed by adjusting the phase of the scaler to obtain an optimum phase for the scaler. It is determined whether the input signal represents a static frame and the phase calibration is performed only if the input signal represents a static frame.

14 Claims, 13 Drawing Sheets

DIGITAL PHASE CALIBRATION METHOD AND SYSTEM

CROSS REFERENCE TO RELATED APPLICATIONS

This application claims the benefit of U.S. Provisional Application No. 60/820,610, filed on Jul. 28, 2006.

BACKGROUND OF THE INVENTION

1. Field of the Invention

The invention relates to digital signal processing, and more particularly to a method and system of digital phase calibration for a TV decoder.

2. Description of the Related Art

Digital display units (e.g., flat panel monitors) are often used for displaying images encoded and transmitted in analog signals. An image source (typically including a digital to analog converter) generates an analog signal representing images according to widely used standards such as VGA or SVGA.

An analog display signal typically comprises a display data signal and associated synchronization signals. The display data signal may be viewed as a series of successive portions in the time domain, each portion generated from a pixel data element representing a point of an image. The image portions are typically generated under the control of a source clock, which drives a digital to analog converter (DAC). The DAC generates the analog display data according to the source clock signal.

FIG. 1 is a block diagram of a conventional display unit, disclosed in U.S. Pat. No. 6,483,447.

The digital display unit may comprise analog to digital converter (ADC) 110, phase adjuster 120, time error detector 130, clock generator 140, variable delay 150, panel interface 160, and digital display screen 170. Digital display screen 170 comprises discrete points commonly referred to as pixels. Each pixel can generally be controlled individually, and all the pixels may be activated to various degrees to display an image on a display screen 170. Panel interface 160 receives digital pixel data elements representing an image from ADC 110, and generates electrical signals compatible with the display screen 170 for displaying images represented by the pixel data elements.

Clock generator 140 may generate a synchronized clock signal based on the synchronization signals. It is often desirable that the synchronized clock signal has the same phase and frequency as a source clock used to generate the accompanying display data signal. The frequency and phase of synchronized clock signal 145 may be determined by the synchronization signals. A phase adjustment circuit may be used to adjust the phase of the sampling clock to precisely track the source clock as described in the following. Time error detector 130, phase adjustor 120, and variable delay 150 recurrent an exemplary implementation of the phase adjustment circuit.

Time error detector 130 may examine the display signals to determine the timing of the synchronized clock signal 145 relative to the source clock signal. Time error detector 130 may be implemented in a combination of hardware, software, and/or firmware, but generally requires a structure sufficient for examining the signal level of the analog display data to determine the t timing of the source clock. Time error detector 130 generates a phase error signal indicating whether the phase of the source clock is earlier than, later than or synchronized with clock signal 145 received from clock generator 140. The phase error signal generated from time error detector 130 can be in one of several forms. For example, an integer may be used for identifying the amount of phase lead/lag. A signal line may alternatively be asserted for period of time in proportion to the amount of lead or lag. In another aspect, a pulse may be generated merely to indicate whether the signals have lagged, are leading, or are synchronized.

Phase adjustor 120 receives the phase error signal from time error detector 130 and determines the amount of phase correction during a current clock cycle (of sampling clock 155). Phase adjustor 120 may operate to include characteristic of a filter to ensure that the phase adjustment does not unduly oscillate from lead to lag and vice versa. Phase adjustor 120 may be implemented in one of several ways. For example, phase error 120 may generate a number or analog signals representing the phase correction. A more detailed description of an embodiment of a phase adjustor is provided in the following.

Variable delay 150 adjusts the phase of the sampling clock 155 according to the delay indicated by the output of the phase adjuster 120. Variable delay 150 may be implemented in a known way. In one embodiment, delay lines of multiple taps may be used to delay the sampling clock 155.

Although sampling clock 155 and synchronized clock signal 145 are described as distinct clock signals, phase adjustor 120 may be viewed as adjusting the phase of the sampling clock as will be apparent to those skilled in the relevant arts. The phase adjustment may alternatively be performed by interfacing with a clock generator in a closed-loop without departing from the scope and spirit of the invention as will also be apparent to those skilled in the relevant arts.

Analog-to-digital converter (ADC) 110 samples the display signals to generate pixel data elements representing an image. The pixel data elements may be recovered accurately because the phase of the sampling clock may be adjusted several times within a horizontal line.

FIG. 2 is a schematic view of a system implementing automatic sampling phase control, disclosed in U.S. Pat. No. 6,268,848.

This embodiment comprises an ADC 210, a clock generator 220, a phase controller 230, an automatic system phase controller (ASPC) 240, a controller 250, and a display processing panel 260. The ADC 210 receives an analog display signal RGBIN. The ADC 210 generates digital samples RGBS at a rate determined by the sampling clock (SCLK). The SCLK is a time delay version of a recovered clock (RCLK). The RCLK is generated by a clock generator 220. The clock generator 220 is generally phase locked to the reference signal associated with the analog display signal. The phase controller 230 generates the SCLK by delaying the phase of the RCLK In accordance with the controller 250.

The automatic system phase controller (ASPC) 240 receives the digital samples generated by the ADC 210. The ASPC 240 processes the digital samples and generates a numerical value or statistical estimation for each display frame based on the digital samples. The phase controller 230 is programmed so that the phase of the SCLK is adjusted to maximize the numerical values generated by the ASPC 240. The controller 250 receives an output of the ASPC 240. The display processing and panel 260 receives the digital samples (RGBS) and the SCLK. The display processing and panel 260 typically performs more synchronization and processing of the digital samples before generating a display image.

As described, phase calibration is typically implemented in the ADC by adjusting the phase of the sampling clock. Two categories of the phase calibration method include manual and automatic phase calibration methods. Automatic phase calibration methods may generate better performance than manual phase calibration methods. It is because automatic phase calibration methods determine the best phase by conducting statistical calculation on characteristics of the input signal, whereas manual phase calibration methods may fail to locate an appropriate phase when processing different input signal.

BRIEF SUMMARY OF THE INVENTION

Methods of digital phase calibration are provided. An exemplary embodiment of a method of digital phase calibration comprises the following. An input analog signal is sampled using a clock. A scaler calculates and interpolates samples of the sampled input analog signal. It is determined whether the input signal represents a static frame. If the input signal represents a static frame, phase calibration is performed by adjusting the phase of the scaler to obtain an optimum phase for the scaler. In some embodiments, the optimum phase of the scaler is obtained by filtering the scaled signal, calculating a statistical value of the filtered signal, and determining whether the statistical value is a maximum value. An exemplary statistical value is calculated by summing the absolute value or square value of the filtered signal.

Systems of digital phase calibration are provided. An exemplary embodiment of a digital phase calibration system comprises a scaler, a filter, a statistical value calculator, and a phase controller. The scaler interpolates samples of a sampled signal. The filter extracts components of a particular frequency spectrum of the scaled signal, for example, high frequency components. The statistical value calculator calculates a statistical value of the filtered signal. The phase controller, if the input signal represents a static frame, performs phase calibration, performing phase calibration by adjusting the phase of the scaler based on the statistical value.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
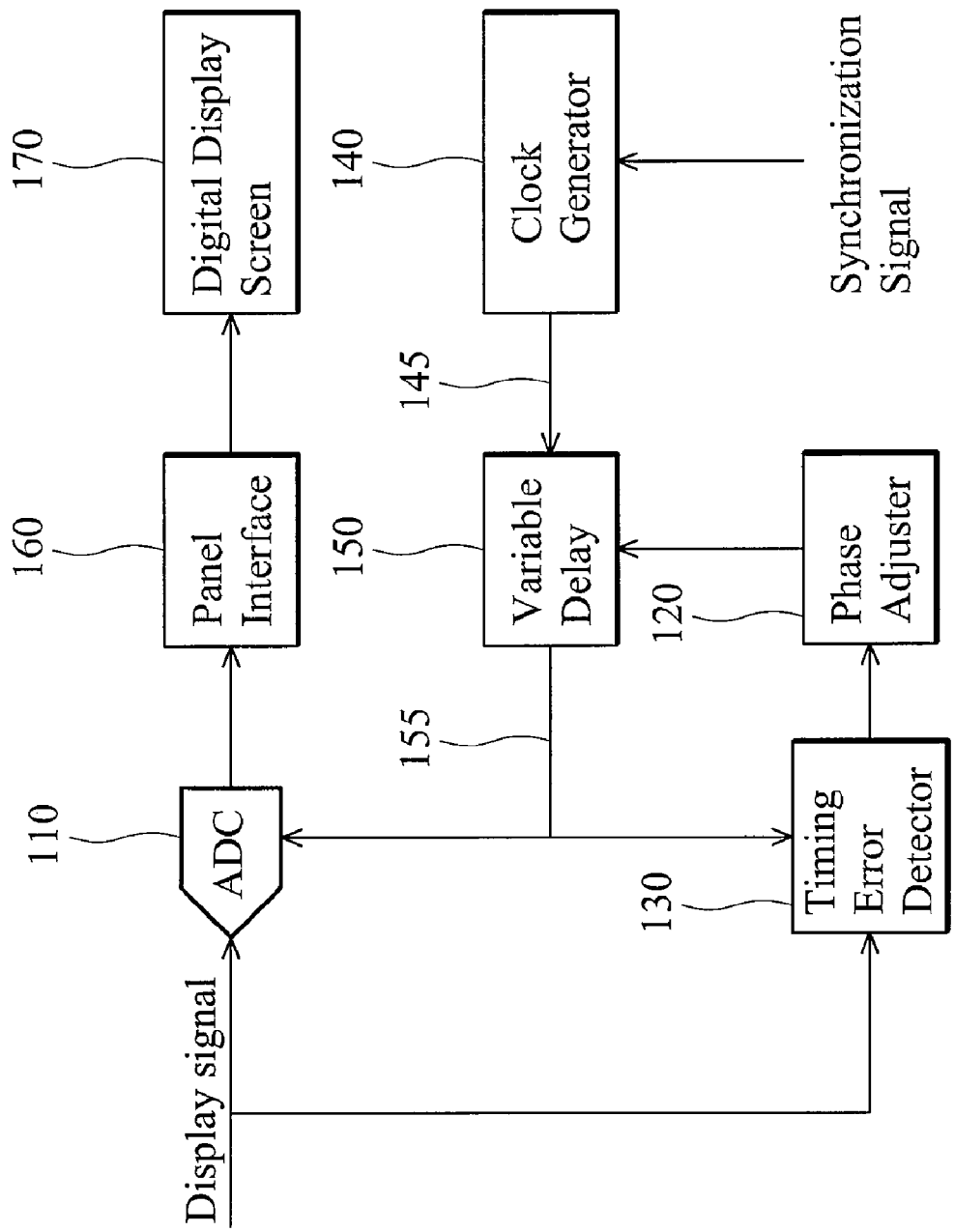
FIG. 1 is a block diagram of a prior art display system.
Figure 2:
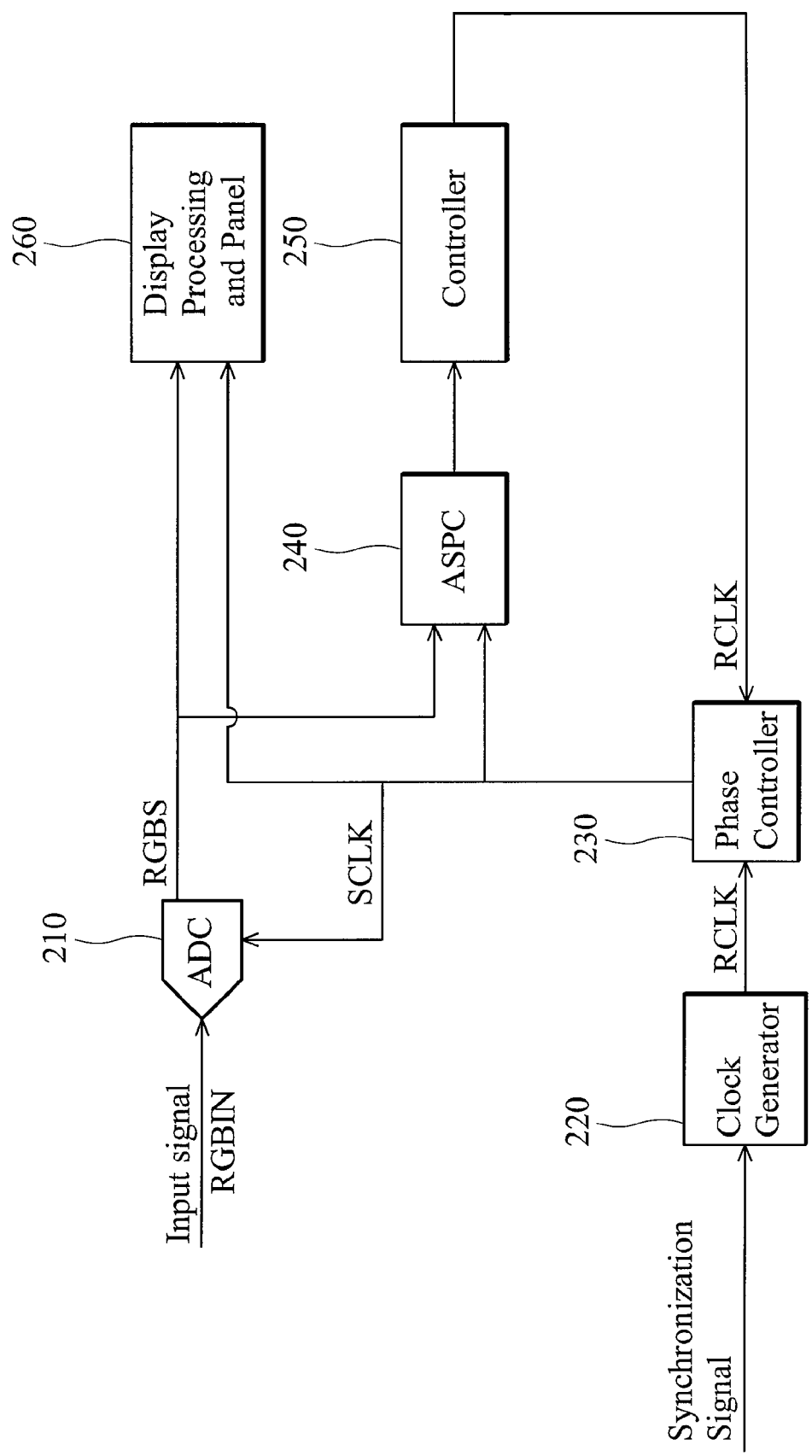
FIG. 2 is a block diagram of another prior art display system.

Several exemplary embodiments of the invention are described with reference to FIGS. 3 through 12, which generally relate to digital phase calibration implemented in scalers or interpolators. It is to be understood that the following disclosure provides various different embodiments as examples for implementing different features of the invention. Specific examples of components and arrangements are described in the following to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various described embodiments and/or configurations.

In NPTV, the highest frequency in the data signal is 6.75 MHz, according to the Nyquist Sampling theorem, the sampling frequency has to be greater than two times the highest frequency to prevent information loss. TV decoders typically sample the input signal into 27 MHz digital signal. The TV signal defined by CCIR 601 only carries 13.5 MHz data, and the sampled input signal is down-sampled from 27 MHz to a lower frequency, for example, from 27 MHz to 4 FSC (FSC is the color carrier frequency of NTSC and PAL, FSC in NTSC is about 3.58 MHz, and FSC in PAL is about 4.43 MHz) for luminance and chrominance separation, and then from 4 FSC to 13.5 MHz. Since 13.5 MHz is not greater than two times the highest frequency 6.75 MHz, the sampled data may distorted if an inappropriate sampling phase is selected. Phase calibration is applied to the video decoding system to ensure undistorted sampled output by selecting appropriate sampling phases.

Referring to FIGS. 4A to 4D, the 6.75 MHz data signal is sampled by a sampling clock equal to 13.5 MHz. FIGS. 4A to 4D show different sampling results with the sampling phase equal to 0, pi/4, pi/2, and 3*pi/4, respectively. The spots represent the sampling results of the 6.75 MHz signal sampled using 13.5 MHz signal. In this case, the amplitude of the output is the greatest when the sampling phase equals to pi/2, which means pi/2 is the best sampling phase.

With respect to a video system with digital scaler (interpolation) function, it is advantageous to implement phase calibration in the scaler with the lowest output clock rate.

Figure 3:
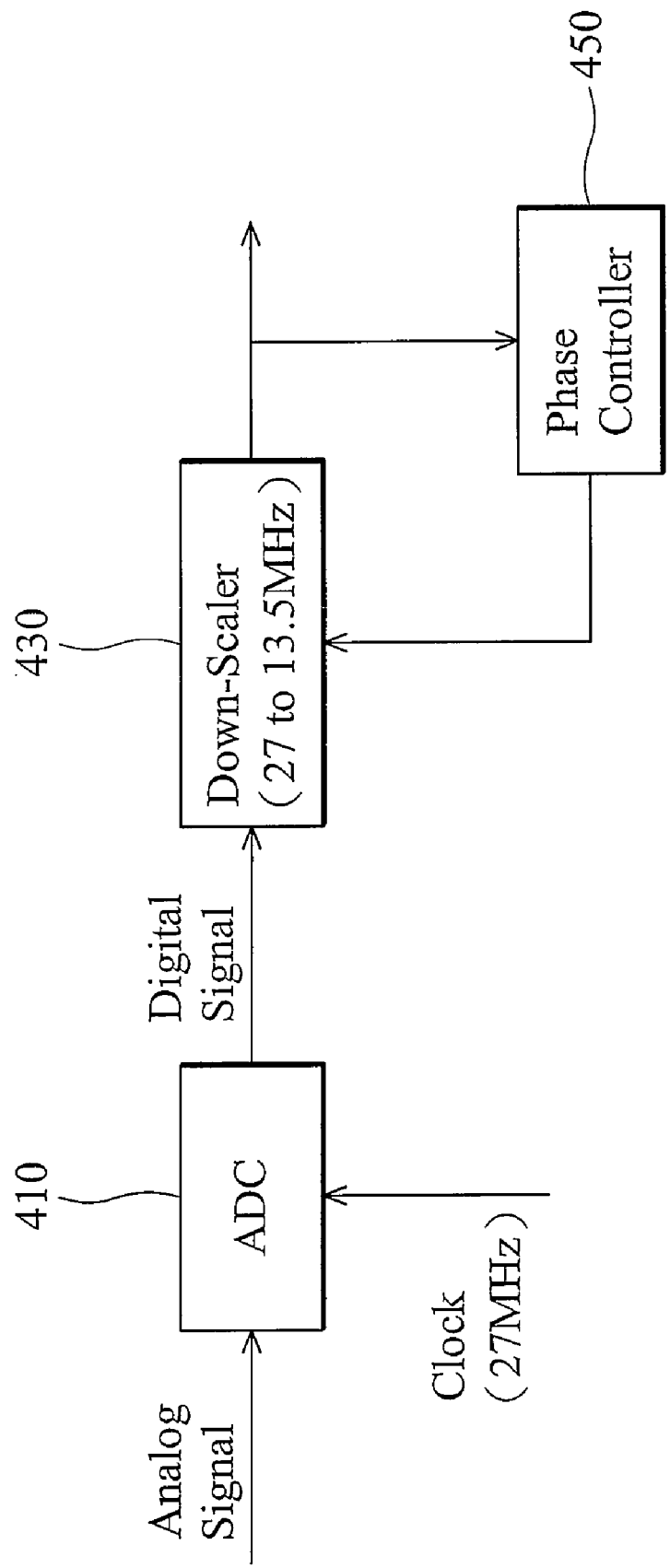
FIG. 3 is a schematic view of an embodiment of implementing digital phase calibration in a down-scaler.
Figure 4A:
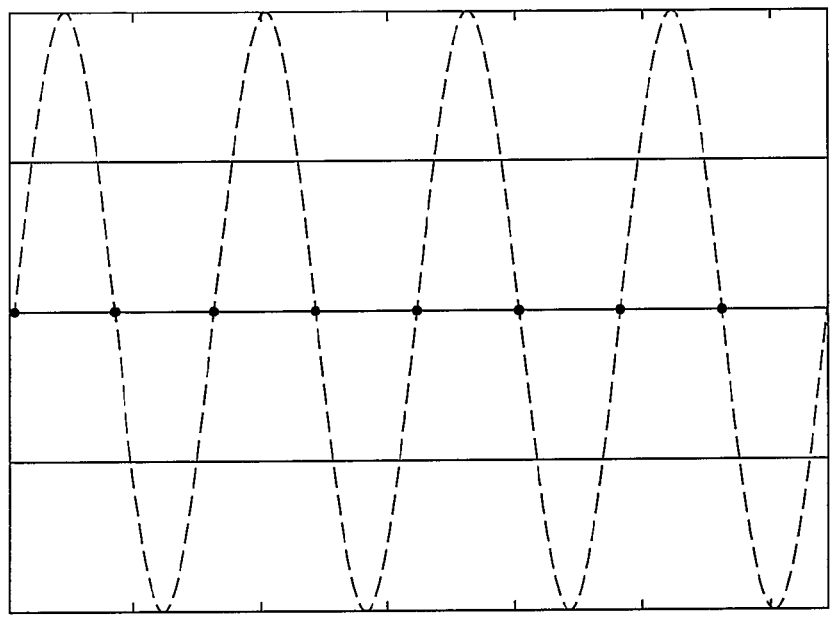
FIGS. 4A~4D are graphs illustrating sampling a 6.75 MHz data signal by 13.5 MHz sampling rate with four different phases.
Figure 4B:
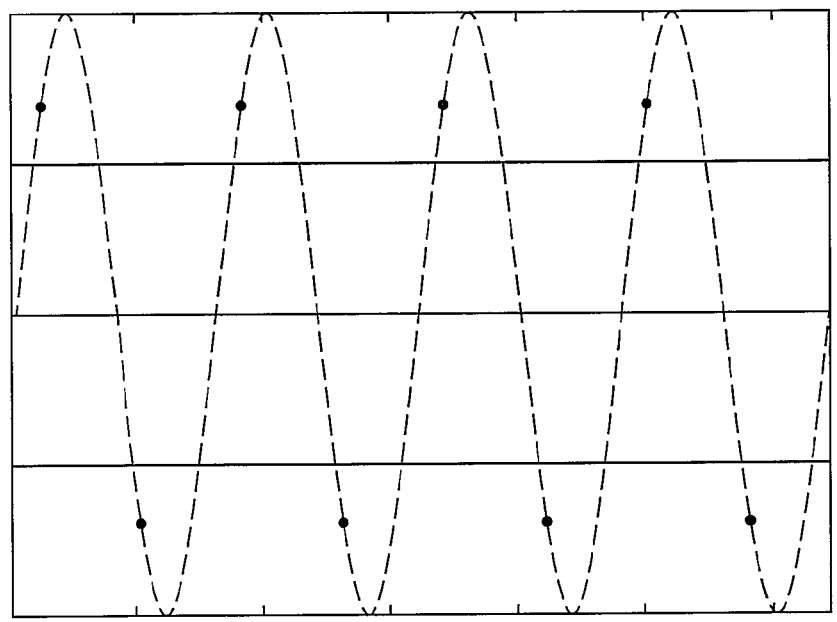
Figure 4C:
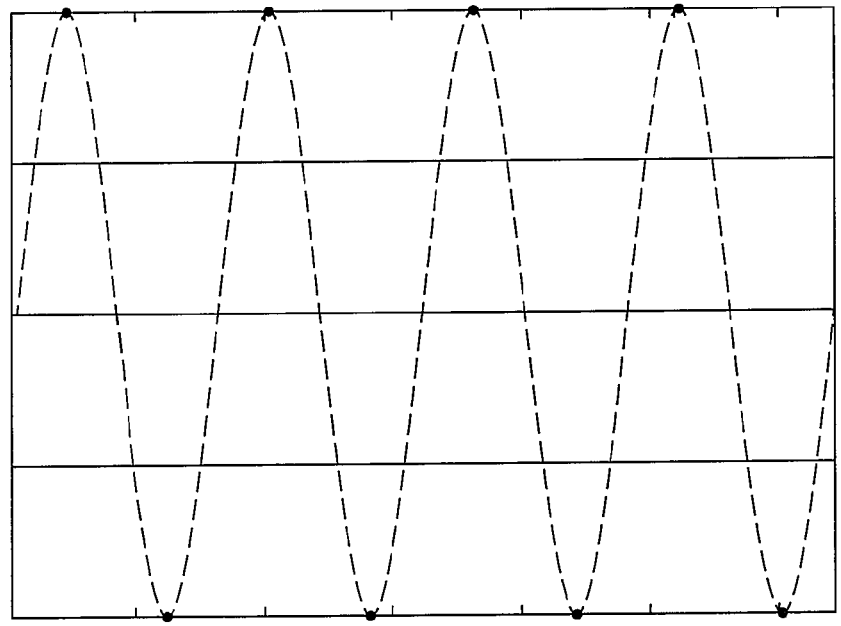
Figure 4D:
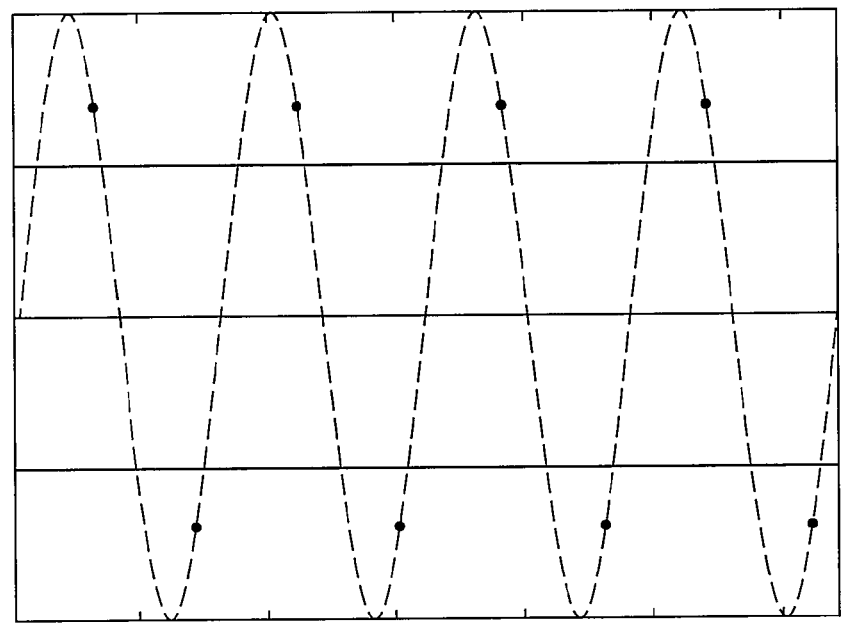

As shown in FIG. 3, for example, ADC 410 samples an analog signal carrying 6.75 MHz data with a sampling clock frequency of 27 MHz, and transmits the sampled signal to down-scaler 430. Down-scaler 430 down scales the sampled signal to 13.5 MHz. Phase controller 450 determines the phase of down-scaler 430 to keep the sampling error as low as possible.

Figure 5:
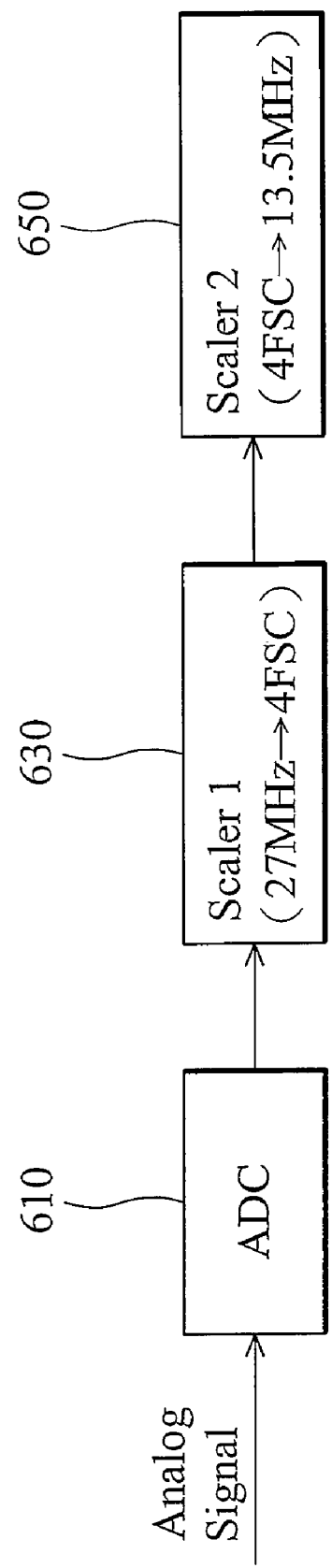
FIG. 5 is a block diagram illustrating an embodiment of a TV decoder having two scalars.
Figure 6:
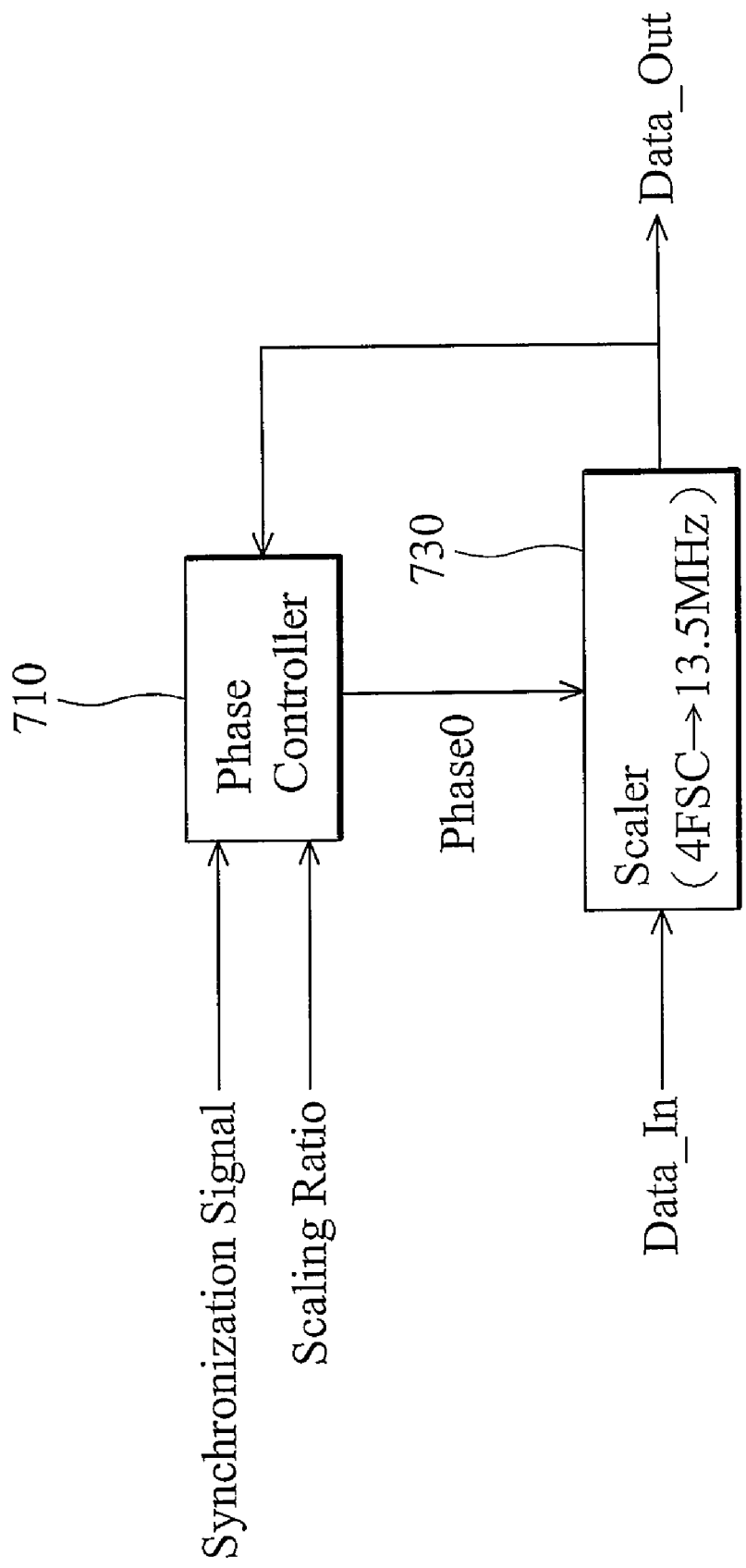
FIG. 6 is a block diagram illustrating an embodiment of a scaler with a phase controller.

As shown in FIG. 5, phase calibration can be performed in ADC 610, or any of the scalers 630, 650. Since the TV decoder accomplishes burst lock and horizontal synchronization (HSYNC) lock in scalers 630, 650, it is meaningless to implement phase calibration in ADC 610. Phase calibration is thus implemented in scaler 650 which has a lower output clock rate compared to scaler 630. Scaler 650 performs HSYNC locking to generate phase for interpolating HSYNC signals. As shown in FIG. 6, phase controller 710 receives a synchronization signal and interpolation ratio to generate phase0. Scaler 730 outputs data according to phase0 received from phase controller 710.

Figure 7:
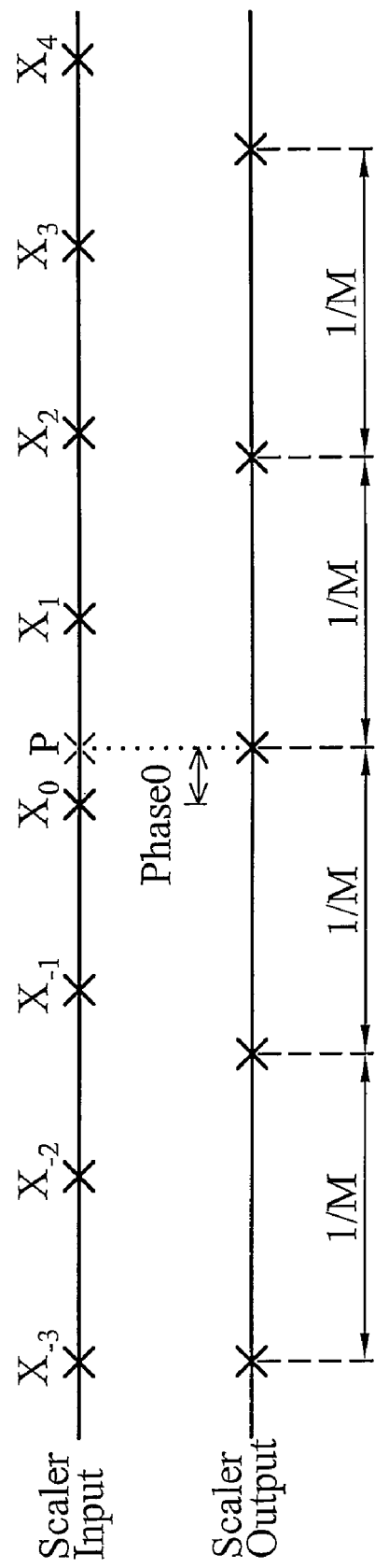
FIG. 7 is a schematic view illustrating an embodiment of scaler inputs and outputs.
Figure 8:
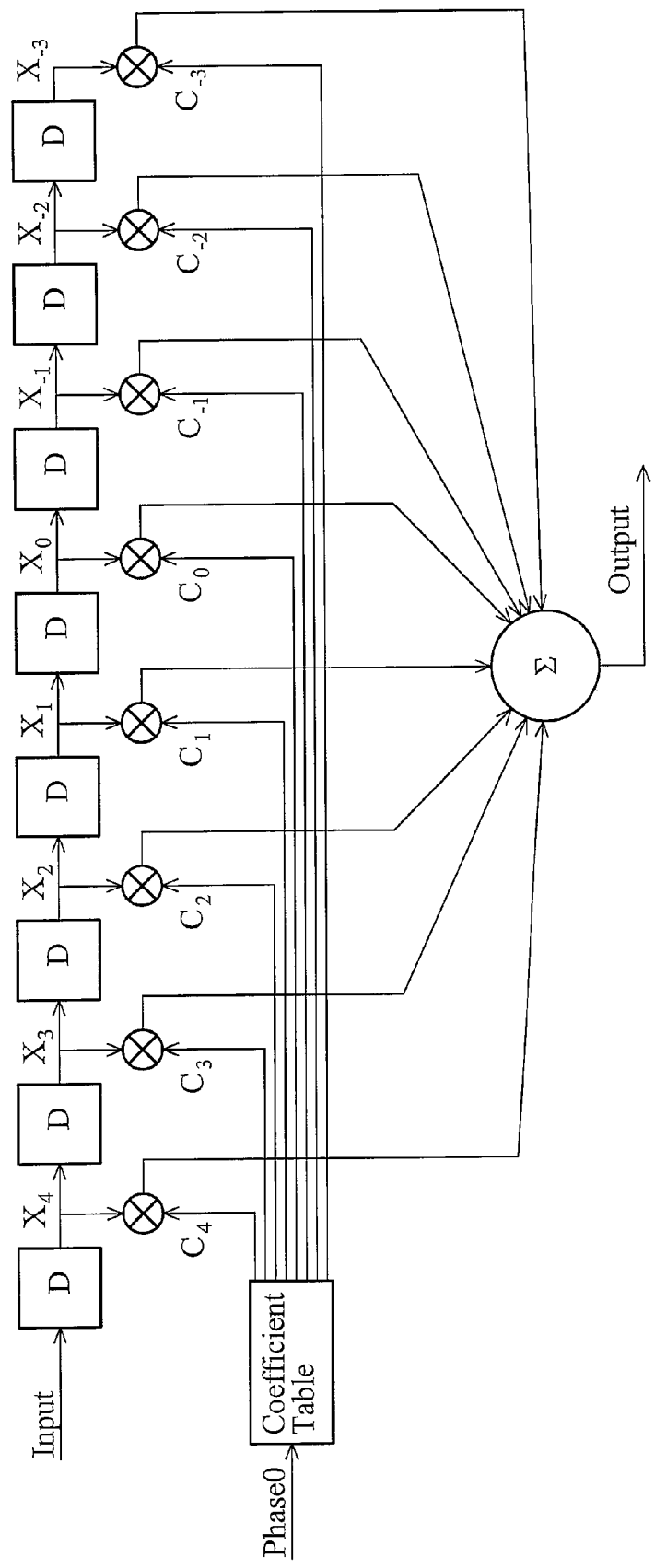
FIG. 8 is a schematic view illustrating an embodiment of a scaler 730 in FIG. 7.

Phase0 is used by scaler 730 to determine the interpolation position. As shown in FIG. 7, the input of scaler 730 is marked as X-3~X4, and the interpolation position (P in FIG. 7) for a current output sample is located based on phase0 with respect to the position of a current input sample X0. FIG. 8 shows an embodiment of scaler 730. A coefficient table receives phase0 to output a set of interpolation coefficients, the output is calculated based on the interpolation coefficients and the input signal. Referring to FIG. 7, an initial phase of scaler 730 came from a down scaling ratio M (M<1) and the synchronization signal.

Figure 9:
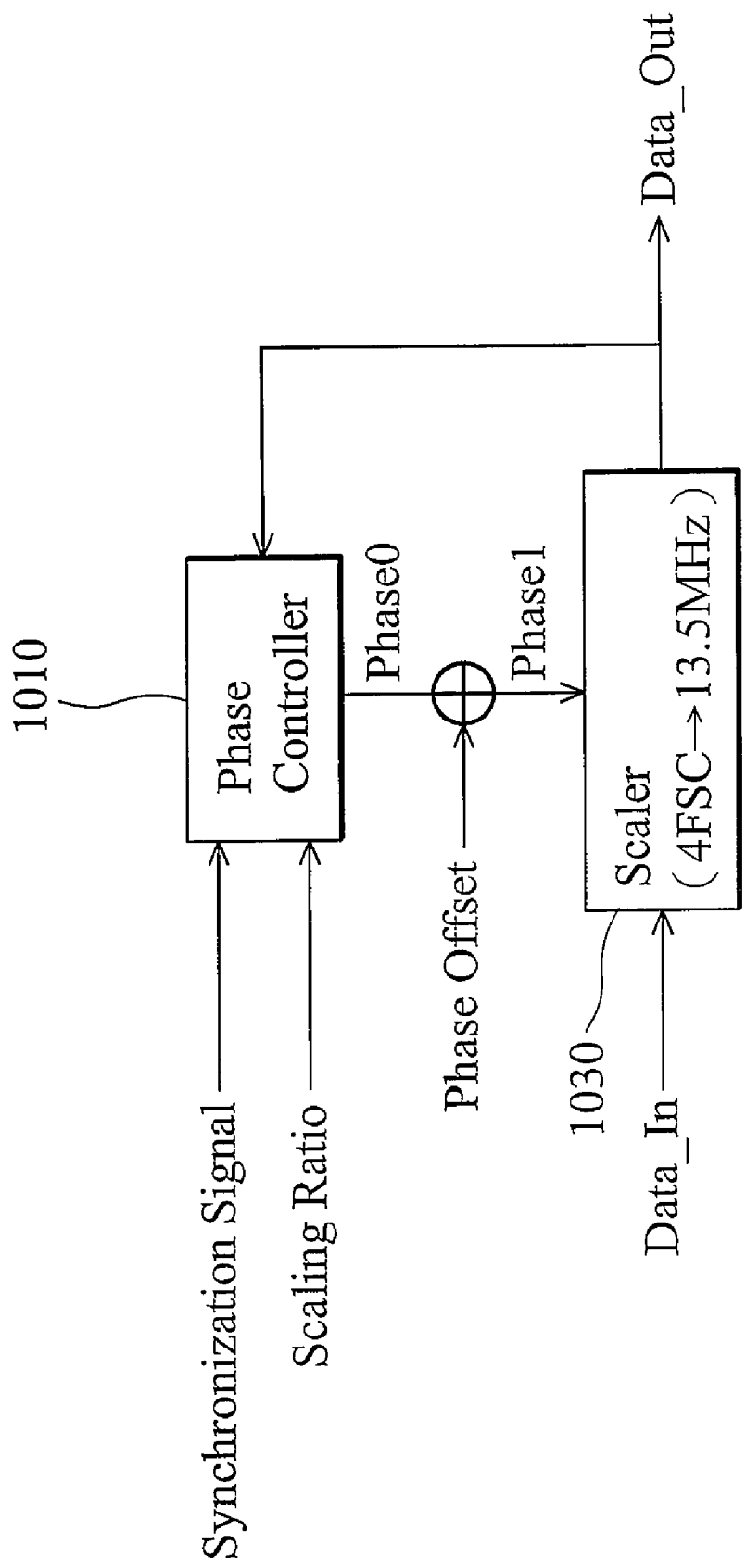
FIG. 9 is a block diagram illustrating an embodiment of a scaler with a phase controller.

HSYNC locking should adequately be performed to stabilize display frames. If a fixed phase offset can be maintained, the frames are normally displayed even though the input data are not aligned with the HSYNC signal. A programmable offset can be added to phase0 for digital manual calibration. Referring to FIG. 9, phase controller 1010 generates phase0 according to the synchronization signal and scaling ratio. A phase offset is then added to phase0, resulting in phase1, which is transmitted to scaler 1030 for phase calibration.

Digital phase calibration may be implemented in a similar manner. One statistical value is generated for each phase offset by calculating an absolute value of the scaled signal in one field. The optimum phase offset maximizes the statistical value. In some embodiments, the statistical value is generated by summing absolute values or square values of the filtered signal of the scaler output signal.

Figure 10:
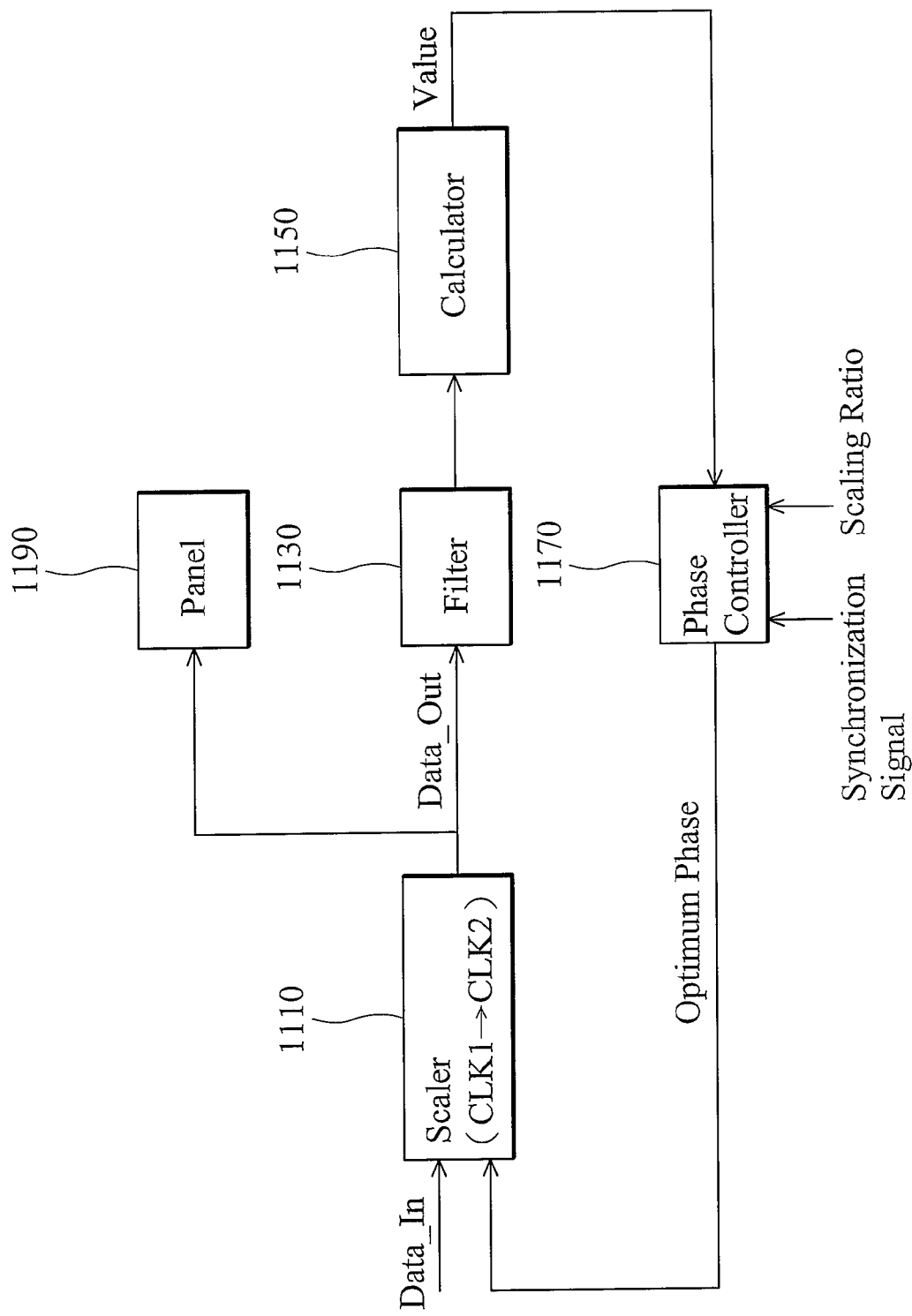
FIG. 10 is a block diagram illustrating an embodiment of a system of digital phase calibration.

FIG. 10 is a block diagram illustrating an embodiment of a system having digital phase calibration function. The system comprises a scaler 1110, a filter 1130, a calculator 1150, a phase controller 1170, and a panel 1190.

An ADC (not shown) samples a display signal and transmits the sampled signal to scaler 1110. Scaler 1110 down-converts (or up-converts) the sampled signals and determines whether successively input images fields or frames change substantially, indicating whether the input signal represents a static display. If the input signal represents a static display, scaler 1110 sets a phase offset to 0 and the scaled signal is passed to filter 1130. Filter 1130 filters desired components of the scaled signal, such as high frequency components, edges, or peaks. Calculator 1150 calculates a statistical value from the filtered signal, for example, an absolute value or energy of the filtered signal. Incrementing the phase offset from 0 to a maximum phase offset to find an optimum phase offset causing a maximum statistical value.

In some embodiments, phase controller 1170 determines whether the statistical value is greater than a maximum value. If the statistical value is greater than the maximum value, phase controller 1170 sets the statistical value and the corresponding phase offset as the maximum value and an optimum phase offset respectively. If the statistical value is less than or equal to the maximum value, phase controller 1170 determines whether the current phase offset is equal to the maximum phase offset. If the current phase offset is still less than the maximum phase offset, phase controller 1170 adds a predetermined value, to the phase offset and passes the updated phase offset to scaler 1110 for another calculation and comparison. If the current phase offset is the maximum phase offset, phase controller 1170 defines the optimum phase offsets as the final phase offset, and it is combined with the initial phase (phase0) determined by the synchronization signal and scaling ratio as an optimum phase for scaler 1110. In this embodiment, phase=phase0+phase offset (the optimum phase offset).

The phase of scaler 1110 is calibrated in order to generate a better scaled signal to be displayed on panel 1190.

Figure 11:
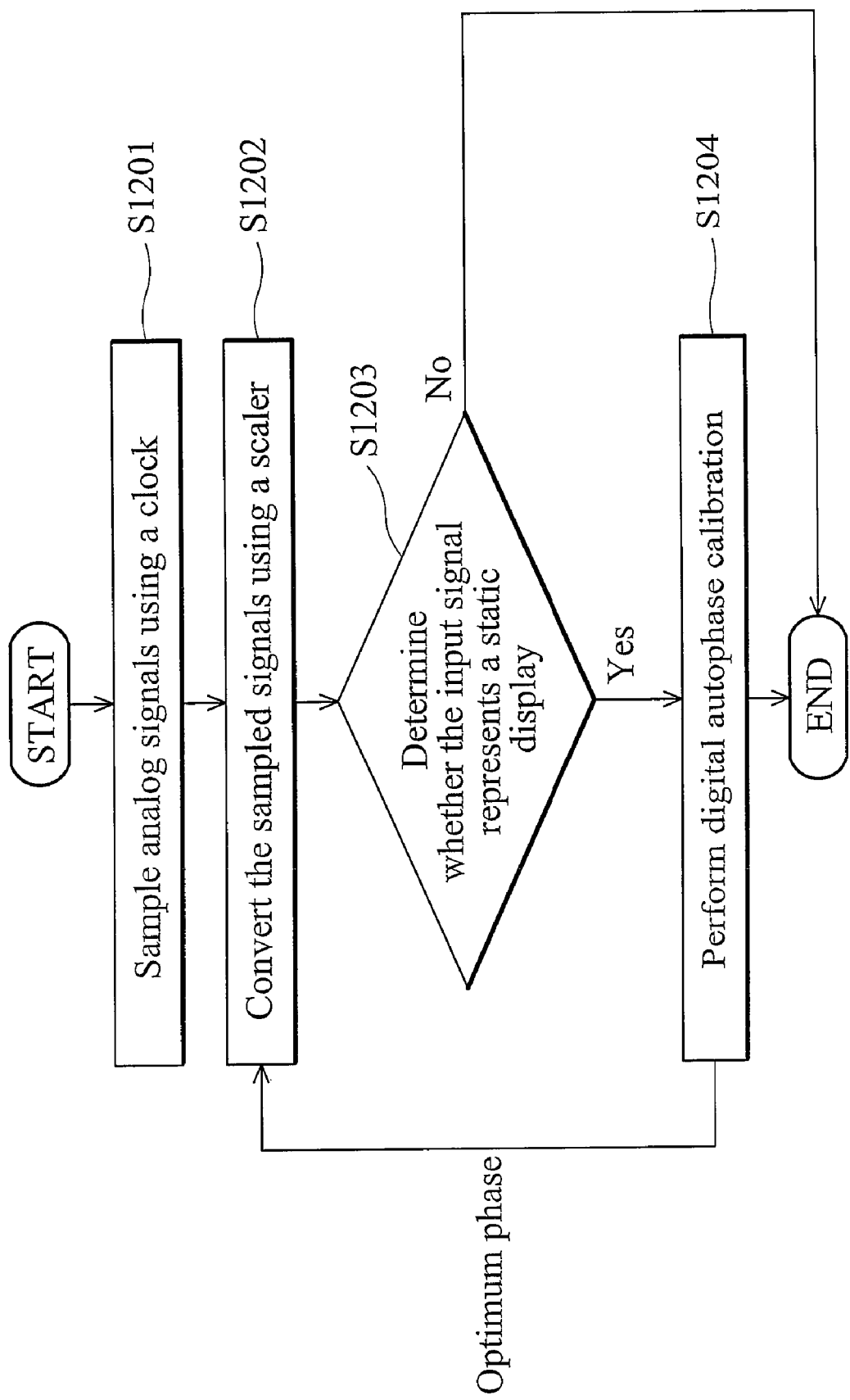
FIG. 11 is a flowchart of an embodiment of a video signal processing method with phase calibration.

FIG. 11 is a flowchart of an embodiment of a video signal processing method. In this embodiment, an initial phase offset, a maximum phase offset, and an incrementing size are first defined. An analog display signal is input and sampled by a clock signal, thus converting the analog display signal to a digital signal (step S1201) and the scaler interpolates samples of the digital signal (step S1202) to generate a scaled signal. An embodiment of the scaler is shown in FIG. 7. It is determined whether successively input images fields or frames change substantially (step S1203), indicating whether the input signal represents a static display. If the input signal represents a static display, digital phase calibration is performed (step S1204) to obtain an optimum phase for the scaler. The scaler may use the optimum phase to scale the digital signal to obtain a better display signal.

Figure 12:
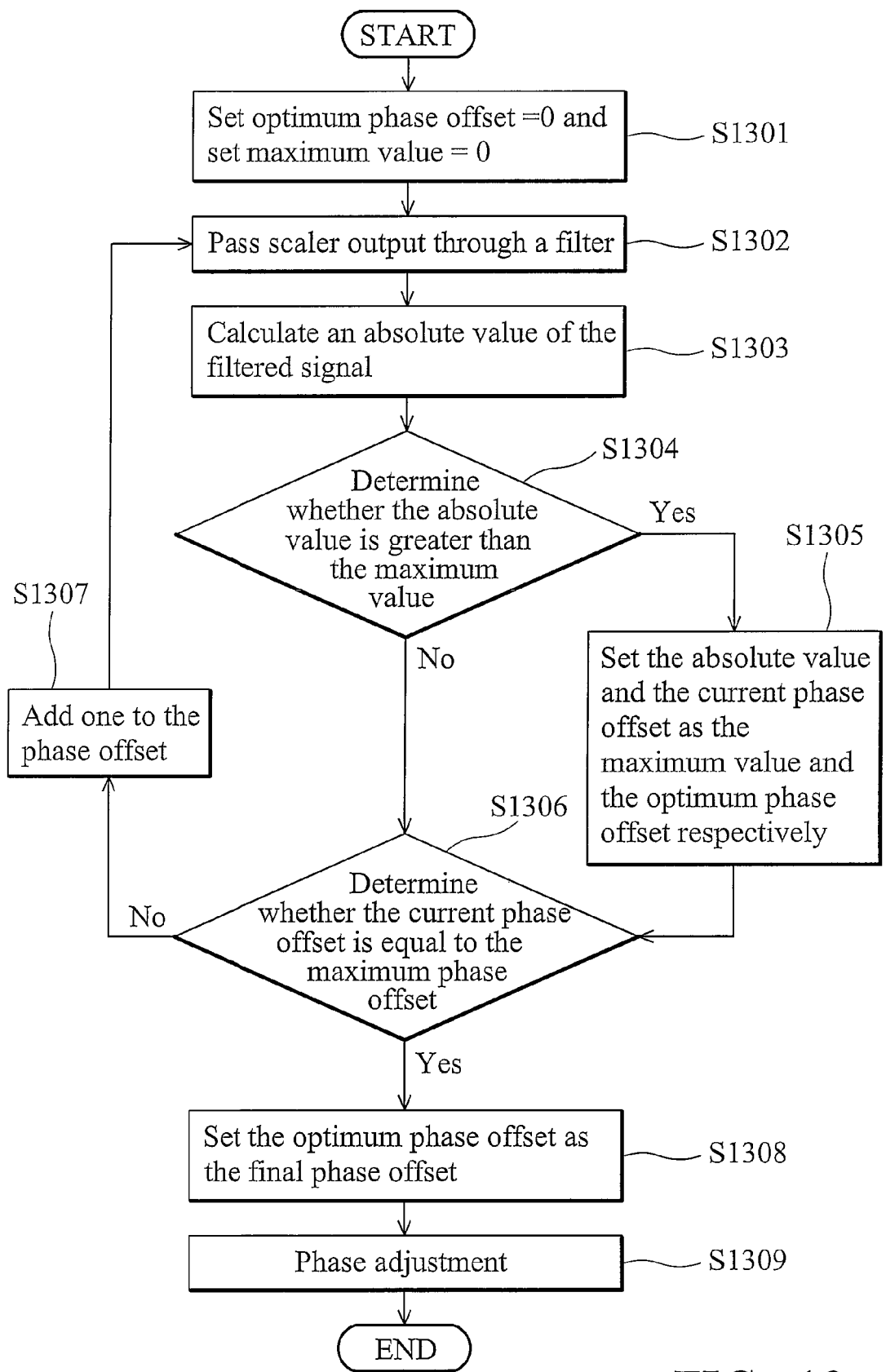
FIG. 12 is a detailed flowchart of an embodiment of the digital phase calibration method.

FIG. 12 is a detailed flowchart of an embodiment of the digital phase calibration method shown in S1204 of FIG. 11.

The initial phase offset is first set to a predetermined value, for example 0 (step S1301). The scaled signal is passed through a filter (step S1302). A statistical value such as a sum of absolute values of the filtered signal is calculated (step S1303). Next, it is determined whether the statistical value is greater than a maximum value (step S1304). If the statistical value is greater than the maximum value, the statistical value and a currently obtained phase offset are set as the maximum value and the optimum phase offset respectively (step S1305). If the absolute value is less than or equal to the maximum value, or if the maximum value or optimum phase offset have been set, it is then determined whether the current phase offset is equal to the maximum phase offset (step S1306). If the current phase offset is not the maximum phase offset, a predetermined incrementing size, one, for example, is added to the phase offset (step S1307), and the process proceeds to step S1302 for another calculation and comparison based on the new phase offset. If the current phase offset is the maximum phase offset, the optimum phase offsets is designated as the final phase offset (step S1308) for deriving the optimum phase for the scaler (step S1309).

Methods and systems of the present disclosure, or certain aspects or portions of embodiments thereof, may take the form of program code (i.e., instructions) embodied in media, such as floppy diskettes, CD-ROMS, hard drives, firmware, or any other machine-readable storage medium, wherein, when the program code is loaded into and executed by a machine, such as a computer, the machine becomes an apparatus for practicing embodiments of the disclosure. The methods and apparatus of the present disclosure may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing and embodiment of the disclosure. When implemented on a general-purpose processor, the program code combines with the processor to provide a unique apparatus that operates analogously to specific logic circuits.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of digital phase calibration, comprising:
sampling an input signal using a sampling clock to generate a sampled signal;
calculating and interpolating samples of the sampled signal by a scaler to generate a scaled signal;
determining whether the scaled signal represents a static display; and
performing phase calibration only when the scaled signal represents the static display, wherein the phase calibration is performed based on the scaled signal by adjusting the phase of the scaler thereby obtaining an optimum phase for the scaler.

2. The method of digital phase calibration as claimed in claim 1, wherein performing phase calibration further comprises:
setting a phase offset to 0;
filtering the scaled signal to generate a filtered signal;
calculating a statistical value of the filtered signal;
determining whether the statistical value is greater than a maximum value; and
if the statistical value is greater than the maximum value, setting the statistical value and a currently obtained phase offset as the maximum value and an optimum phase offset respectively.

3. The method of digital phase calibration as claimed in claim 2, further comprising:
if the statistical value is less than or equal to the maximum value, determining whether the current phase offset is equal to a maximum phase offset;
if the current phase offset is less than the maximum phase offset, adding a predetermined value to the phase offset and repeating statistical value calculation and comparison based on the currently obtained phase offset to update the maximum value and the optimum phase offset;
if the current phase offset is equal to the maximum phase offset, designating the optimum phase offsets as the final phase offset for display adjustment.

4. The method of digital phase calibration as claimed in claim 3, wherein the scaler interpolates samples of the sampled signal to generate the scaled signal using the optimum phase derived from an initial phase and the final phase offset.

5. The method of digital phase calibration as claimed in claim 4, further comprising generating an initial phase based on a synchronization signal and an interpolation ratio.

6. The method of digital phase calibration as claimed in claim 2, wherein the statistical value is calculated by summing the absolute value or square value of the filtered signal.

7. The method of digital phase calibration as claimed in claim 1, further comprising altering the phase of the scaler by a programmable phase offset.

8. A system of digital phase calibration, comprising:
a scaler, interpolating samples of a sampled signal to generate a scaled signal;
a filter, coupled to the scaler, filtering the scaled signal to generate a filtered signal;
a statistical value calculator, coupled to the filter, calculating a statistical value of the filtered signal; and
a phase controller, coupled to the calculator and the scaler, performing phase calibration only when the statistical value represents a static display, wherein the phase calibration is performed by adjusting the phase of the scaler based on the statistical value.

9. The system of digital phase calibration as claimed in claim 8, wherein the phase controller initially sets a phase offset to 0, determines whether the statistical value is greater than a maximum value, if so, sets the statistical value and a currently obtained phase offset as the maximum value and an optimum phase offset respectively.

10. The system of digital phase calibration as claimed in claim 9, wherein the phase controller determines whether the current phase offset is equal to a maximum phase offset if the absolute value is less than or equal to the maximum value, adds a predetermined value to the phase offset and repeating statistical value calculation and comparison based on the currently obtained phase offset if the current phase offset is less than the maximum phase offset, and designates the optimum phase offsets as the final phase offset for display adjustment if the current phase offset is equal to the maximum phase offset.

11. The system of digital phase calibration as claimed in claim 10, wherein the scaler interpolates samples of the sampled signal to generate the scaled signal using the optimum phase derived from an initial phase and the final phase offset.

12. The system of digital phase calibration as claimed in claim 11, wherein the phase controller further generates an initial phase based on a synchronization signal and an interpolation ratio.

13. The system of digital phase calibration as claimed in claim 8, wherein the statistical value calculator calculates the statistical value by summing the absolute value or square value of the filtered signal.

14. The system of digital phase calibration as claimed in claim 8, wherein the filter is a high pass filter.

* * * * *